United States Patent [19]

Rosenberg

[11] Patent Number: 4,516,092

[45] Date of Patent: May 7, 1985

[54] LEADLESS FILTER COMPONENT

[75] Inventor: Michael A. Rosenberg, Tarzana, Calif.

[73] Assignee: SFE Technologies, San Fernando, Calif.

[21] Appl. No.: 467,605

[22] Filed: Feb. 18, 1983

[51] Int. Cl.³ .................. H03H 7/075; H03H 7/01
[52] U.S. Cl. ................................ 333/184; 333/167; 333/185
[58] Field of Search ................ 333/167, 174–185; 361/306, 309, 313, 328–330, 380, 392–393, 416, 422

[56] References Cited

U.S. PATENT DOCUMENTS 3,521,200  7/1970  Matsushima et al. .......... 333/185 X
3,593,217  7/1971  Weber ................................ 333/175
3,809,973  5/1974  Hurley ............................ 361/309 X Primary Examiner—Marvin L. Nussbaum
Attorney, Agent, or Firm—Christie, Parker & Hale

[57] ABSTRACT

A leadless filter component for printed circuits comprises a monolithic ceramic capacitor chip having a ceramic nonconductive outer surface and at least two conductor terminals formed on said outer surface. An inductance including a bobbin and a conductor wound on the bobbin has the bobbin secured to the outer surface of the capacitor chip with the two ends of the conductor being electrically secured to said terminals to form a component having inductive and capacitive reactance.

6 Claims, 5 Drawing Figures

4,516,092

LEADLESS FILTER COMPONENT

FIELD OF THE INVENTION

This invention relates to leadless circuit components and, more particularly, is concerned with a filter component for use on printed circuits or ceramic substrates.

BACKGROUND OF THE INVENTION

The use of printed circuit boards and ceramic substrates in making up electronic circuits is well-known. Various electrical components, such as resistors, capacitors, inductors, transformers, and transistors are mounted on the printed circuit board by soldering the leads from the components to conductors formed on the surface of the printed circuit board. More recently, leadless components have come into use which are provided without electrical leads, but which can still be soldered directly to the conductors formed on the printed circuit boards. The result has been higher reliability, lower cost, and a saving in board area, allowing more components to be attached to the circuit board or the circuit board made substantially smaller.

Monolithic ceramic capacitors, for example, are available in which the conductive plates of the capacitor are embedded in a ceramic body. The plates are arranged in alternate sets which are electrically connected to external electrode terminals in the form of metalized pads on the opposite ends of the ceramic body. The metalized surfaces can be directly soldered to the printed circuit board. Inductor components include a spool secured to the surface of an alumina chip. Metalized pads are formed on opposing edges of the chip and a wire or conductor wound on the spool is soldered to the metalized pads. Transformers have been made in the same way. The metalized pads are soldered directly to the printed circuit board.

In the past, it has been the practice to provide a single power supply for providing DC power to one or more printed circuit boards which together form an electronic circuit. As the size and cost of transistors and other circuit components have decreased, it has been found advantageous to provide each printed circuit board with its own power supply. There has therefore developed a need for a low-pass filter component which can be attached directly to the printed circuit board to provide filtering of rectified AC voltage. The present invention is directed to a leadless π-filter component which can be used as power supply filter and which can be soldered directly to a printed circuit board as a single circuit component.

In brief, the present invention provides a π-filter comprising a monolithic ceramic capacitor chip including two groups of parallel conductive plates embedded in a ceramic block. The plates of each group are arranged in two interleaved sets. A first set of plates for both groups extend to a common face of the chip on which is formed a single conductive electrode terminal in the form of a metalized layer on the face of the chip. Each of the other sets of plates of the respective groups are each connected to two separate conductive electrode terminals spaced along an opposing face of the chip. An inductor includes a bobbin secured to another face of the chip. Extending between the two electrode terminals on one face of the chip is a conductor wound on the bobbin to form an inductive coil, opposite ends of the conductor being electrically connected to the two electrode terminals.

DESCRIPTION OF THE DRAWINGS

For a more complete understanding of the invention, reference should be made to the accompanying drawings, wherein.

DETAILED DESCRIPTION

Figure 1:
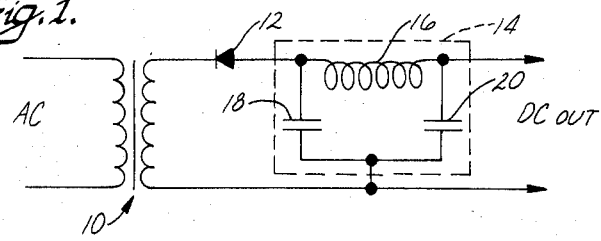
FIG. 1 is a schematic circuit diagram of a low-pass or π-filter.
Figure 2:
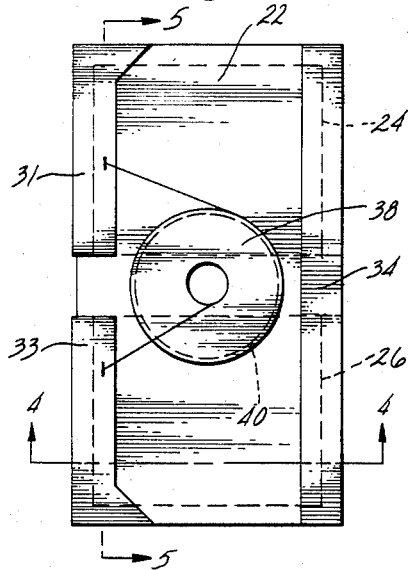
FIG. 2 is a top view of a preferred embodiment of the present invention.
Figure 5:
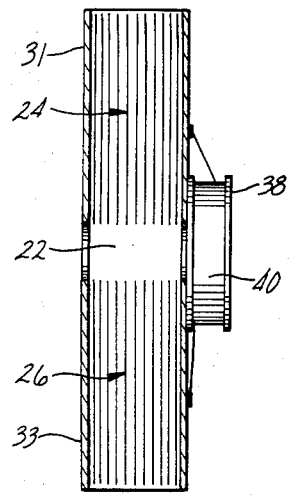
FIG. 5 is a sectional view taken substantially on the line 5—5 of FIG. 2.
Figure 3:
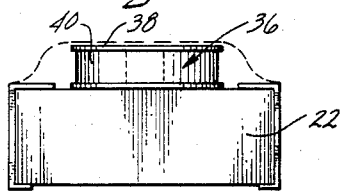
FIG. 3 is an end view of the embodiment of FIG. 2.

Referring to FIG. 1, there is shown the schematic of a typical half-wave rectifier circuit which is used to provide DC power to a printed circuit board or ceramic substrate. The secondary of a transformer 10 is connected through a diode rectifier 12 to a load through a low-pass or a π-filter, indicated generally at 14. The filter includes a series inductor 16 and first and second shunting capacitors 18 and 20. According to the present invention, the filter 14 is constructed as a leadless component chip in the manner described below in connection with FIGS. 2-5.

Figure 4:
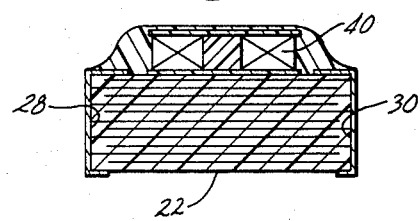
FIG. 4 is a sectional view taken substantially on the line 4—4 of FIG. 2.

The capacitors 18 and 20 are constructed in a single monolithic ceramic body 22. Embedded within the ceramic body are two groups 24 and 26 of spaced parallel conductive layers. These conductive layers form the plates of two separate capacitors. As best seen in FIG. 4, alternate ones of the conductive layers in each group are slightly offset from each other so that one set of layers extends to a front surface 28 of the body 22 and a second set, interleaved with the layers of the first set, extends to a back surface 30 of the body 22.

The front and back surfaces 28 and 30 of the ceramic body 22 are metalized with a layer of silver or other suitable conductive material to form electrode terminals which are each in electrical contact with respective ones of the two sets of interleaved layers embedded in the ceramic body. The metalization on the front surface 28 is divided to form two separate electrode terminals 31 and 33 while the metalization extends the full length of the body 22 along the back surface 30, to form one electrode terminal 34. Thus the two groups 24 and 26 of conductive layers form two capacitors having one electrode of each capacitor connected to a common terminal 34 while the other electrodes of the two capacitors are connected respectively to the two terminals 31 and 33.

An inductor, indicated generally at 36, includes a bobbin or spool 38. The bobbin is mounted with the axis of revolution perpendicular to the top surface of the ceramic body 22, with one face of the bobbin cemented or otherwise secured to the top surface of the chip. A conductive wire is wound in the form of a coil 40 on the bobbin 38.

The ends of the coil 40 are soldered or otherwise electrically connected to the terminals 31 and 33. The bobbin and top surface of the ceramic body can then be covered with a sealing compound which serves to protect the bobbin and the wire coil connections.

While the embodiment shown in the drawings is for a π-filter, it will be understood that other circuit components can be constructed in a similar manner. For example, a tuned circuit formed by an inductor and a capacitor in parallel may be provided by connecting one end of the wire coil 40 to the terminal 34 rather than the terminal 33. The terminal 33 can be connected directly to the terminal 31.

A "ladder" filter can be constructed by adding additional capacitor sections on one end of the capacitor chip and connecting an additional coil for each added capacitor section. Almost any configuration filter made up of capacitors and inductors can be constructed in this manner.

What is claimed is:

1. A $\pi$-filter comprising a monolithic ceramic capacitor chip including at least two groups of parallel conductive plates embedded in a ceramic chip, the plates of each group forming two sets, the plates of the first set being interleaved with the plates of the second set, the plates of the first set of both groups extending to a first face of the chip but not the other faces, the plates of the second set of both groups extending to a second face of the chip opposite the first face but not the other faces, a first conductive layer on the first face in electrical contact with the first set of plates of both the first and second groups, second and third conductive layers on second face of the chip in electrical contact respectively with the second set of plates of the first group and of the second group, and an inductor including a bobbin secured to a third face of the chip and a conductor wound on the bobbin, opposite ends of the conductor being electrically connected respectively to the second and third conductive layers.

2. Apparatus of claim 1 wherein the bobbin is made of a magnetic material.

3. Apparatus of claim 2 wherein the material is ferrite.

4. Apparatus of claim 1 wherein the third face extends perpendicular to both the first and second faces of the block.

5. Apparatus of claim 4 wherein the conductive layers on the first and second faces overlap adjacent margins of the third face.

6. Apparatus of claim 1 wherein the bobbin and conductor are encapsulated by a layer of insulating material applied to the third face of the chip.

* * * * *